United States Patent [19]

Shimizu et al.

[11] 4,396,895

[45] Aug. 2, 1983

[54] MULTIPLE RESONANT ELECTROMECHANICAL FILTERS USING EDGE-MODE VIBRATION OF A LONG PIEZOELECTRIC PLATE

[75] Inventors: Hiroshi Shimizu; Yuji Iseki, both of Sendai; Hiroshi Watanabe, Tagajo, all of Japan

[73] Assignee: Tohoku Metal Industries, Ltd., Miyagi, Japan

[21] Appl. No.: 266,073

[22] Filed: May 21, 1981

[30] Foreign Application Priority Data

Nov. 21, 1980 [JP] Japan .............................. 55-163185
Nov. 21, 1980 [JP] Japan .............................. 55-163186

[51] Int. Cl.³ ...................... H03H 9/125; H03H 9/58; H03H 9/60; H03H 9/15
[52] U.S. Cl. ................................. 333/189; 333/197; 333/198
[58] Field of Search .............. 310/321, 323, 328, 358, 310/365-368, 330, 353; 333/197-201, 187-190

[56] References Cited

U.S. PATENT DOCUMENTS 3,086,183 4/1963 Schöfer .............................. 333/197

*Primary Examiner*—Marvin L. Nussbaum
*Attorney, Agent, or Firm*—Posnack, Roberts, Cohen & Spiecens

[57] ABSTRACT

A multimode piezoelectric mechanical filter using edge-mode piezoelectric transducers, each comprising a semi-infinite or long piezoelectric plate polarized in the thickness direction, and a pair of exciting electrodes formed on the plate at an end portion thereof. Input and output edge-mode transducers are supported at their other ends together with optional resonator elements. The transducer and/or resonator elements are mechanically coupled with one another by a coupling rod at their end portions opposite the support to transmit the edge-mode vibration from one to the other. All of the transducers and resonator elements may be disposed in a common plane and may be integrally formed by punching a single piezoelectric plate to form a monolithic type mechanical filter. In such monolithic type filter, coupling rods are also integrally formed with the transducers and resonators. Alternatively, the transducer regions and/or resonator regions are separated and defined by a slit or slits formed in a large square piezoelectric plate, the bottom portion of each slit being usable as the mechanical coupling.

37 Claims, 30 Drawing Figures

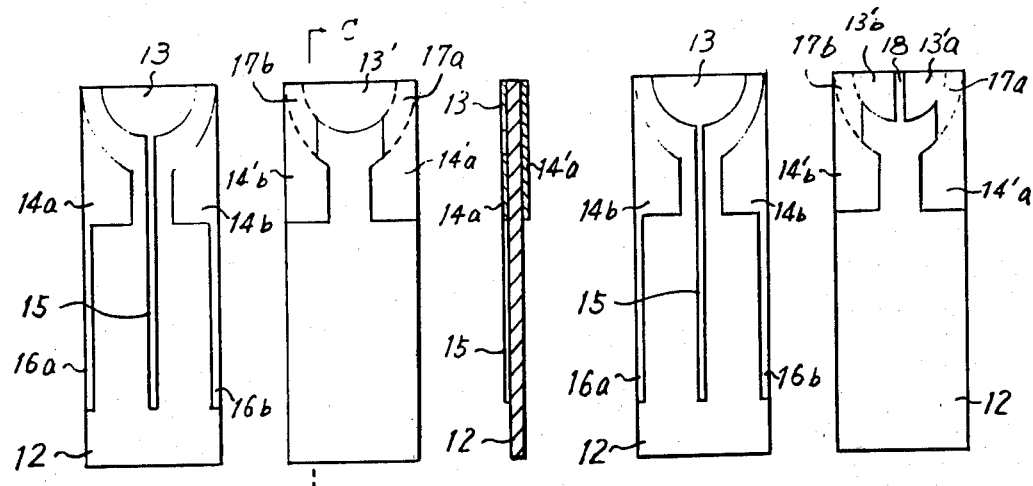
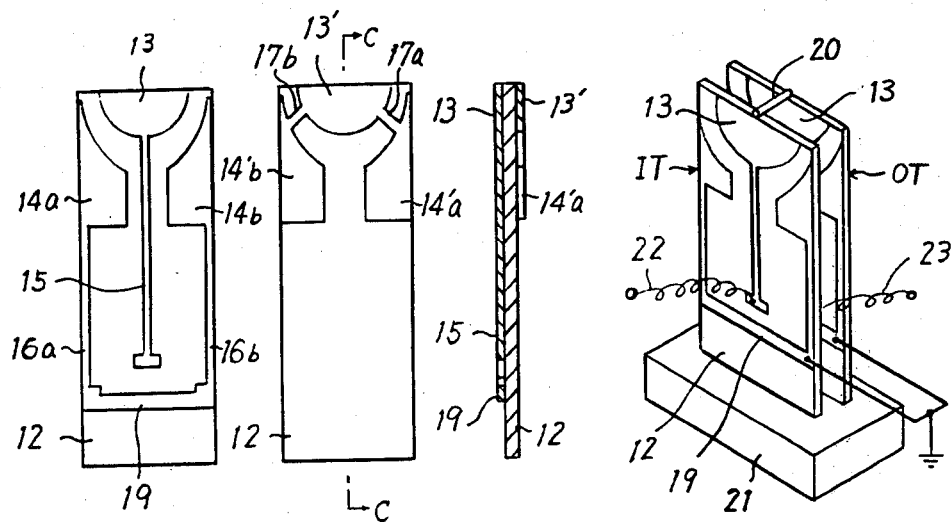
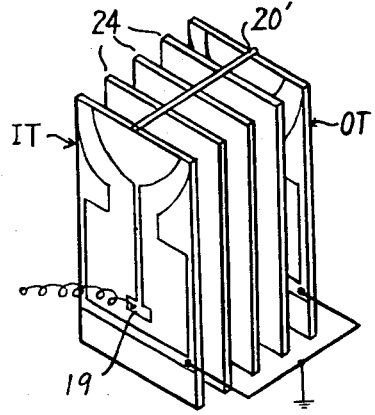

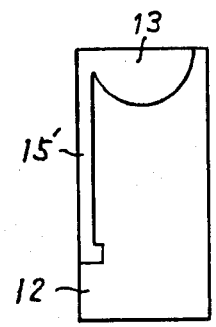 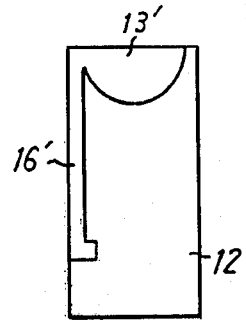 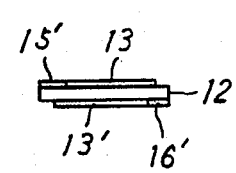
Fig. 20a     Fig. 20b     Fig. 20c
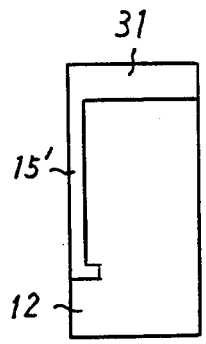 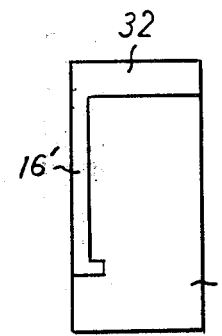 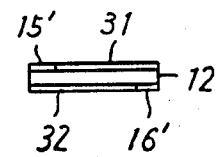
Fig. 21a     Fig. 21b     Fig. 21c

MULTIPLE RESONANT ELECTROMECHANICAL FILTERS USING EDGE-MODE VIBRATION OF A LONG PIEZOELECTRIC PLATE

BACKGROUND OF THE INVENTION

This invention relates to piezoelectric mechanical filters, and in particular, to the provision of novel multiple resonant mechanical filters using edge-mode vibration of a long or semi-infinite piezoelectric plate.

An electromechanical filter generally includes an input electromechanical transducer, an output electromechanical transducer and mechanical coupling means for transmitting vibration from the input transducer to the output transducer, and has been mainly used in MF applications such as IF filters. In many cases, one or more mechanical resonators are interposed between the input and output transducers, and are connected thereto by mechanical coupling means. Piezoelectric transducers are used for the input and output transducers in the piezoelectric mechanical filters.

As well known in the prior art, transducers and resonators in mechanical filters vibrate at a selected mode, for example, a contour mode of a square plate or a circular disk, flexural mode of a circular disk, a longitudinal mode of a rectangular plate or a bar, or a torsional mode of a column. Therefore, there are difficult problems in support of transducers and resonators and connection of lead wires thereto.

In the prior art, the support of resonators and transducers and the connection of electric leads thereto have been made by pressing metal terminal plates having a projection onto a portion corresponding to a node of the vibration, or by fixing lead wires and support wires at the portion of the node of the vibration by a solder agent.

The former has problems in reliability of registry of the projection with the node portion and in failure of contact therebetween. The latter has such faults that the fixing operation of the lead and support is difficult, and that resonant frequency is elevated by the deposited increased stiffness by solder agent.

SUMMARY OF THE INVENTION

It is an object of this invention to provide a multiple resonant piezoelectric mechanical filter wherein the support of transducers and resonators and the connection of lead wires thereto can be readily and reliably made by positively using vibration of an edge mode of a long piezoelectric plate.

It is another object of this invention to provide a wide-band multiple resonant mechanical filter using the edge-mode vibration of a piezoelectric plate which is excellent in filter response, anti-mechanical shock and vibration, and reliability.

It is still another object of this invention to provide a multiple resonant mechanical filter of a monolithic type using the edge-mode vibration of a piezoelectric plate.

It is yet another object of this invention to provide a multiple resonant mechanical filter of a reduced size.

It is another object of this invention to provide a multiple resonant mechanical filter which is ready in production and construction, and reduced in cost.

According to this invention, a multiple resonant piezoelectric mechanical filter comprises an input resonator/transducer element and an output resonator/transducer element. The input resonator/transducer element has a first long piezoelectric plate means which are polarized in its thickness direction and have a width determined resonance frequency. First and second exciting electrode means are formed on an end portion of the first long piezoelectric plate means to excite the first piezoelectric plate means to vibrate in an edge mode. First and second input terminal means are connected with the first and second exciting electrode means, respectively. The output resonator/transducer element has a second long piezoelectric plate means which are polarized in its thickness direction and have a width determined by a predetermined resonance frequency. First and second output electrode means are formed on an end portion of the second long piezoelectric plate means to take out a signal corresponding to edge-mode vibration of the second piezoelectric plate means. First and second output terminal means are connected with the first and second output electrode means, respectively. The second output terminal means are connected with the second input terminal means. The input and output resonator/transducer elements are coupled by mechanical coupling means so that the edge-mode vibration is transmitted from the input resonator/transducer element to the output resonator/transducer element. The first and second piezoelectric plate means are supported at their other ends.

When an electrical signal is applied to the first and second input terminal means, the first piezoelectric plate means are excited at the edge-mode vibration of the resonance frequency. The edge-mode vibration is transmitted to the output resonator/transducer element through the mechanical coupling means. Then, the second piezoelectric plate means also vibrates at the edge-mode resonance frequency. The electrical signal of the resonance frequency is taken out from the output terminal means.

At least one resonator means of a long vibratory plate may be interposed between the input and output resonator/transducer elements. One end portion thereof is connected to the mechanical coupling means and the other end portion is supported.

In one aspect of this invention, the input and output transducer elements and the resonator means are disposed parallel to one another to extend in different parallel planes.

In another aspect of this invention, the input and output transducer elements and the resonator means are disposed in a common plane parallel to one another. Adjacent ones of the input and output transducer elements and the resonator means are connected by a coupling rod at their side edges near one of their ends opposite their supported ends. The first piezoelectric plate of the input transducer element, the second piezoelectric plate of the output transducer element, the coupling rods and the supporting means may be formed integral with one another by punching a piezoelectric plate.

In still another aspect of this invention, a monolithic mechanical filter is obtained. A generally rectangular piezoelectric plate has slits extending from its one end edge at equally spaced positions in a direction perpendicular to the end edge. A plurality of regions corresponding to the first and second piezoelectric plate means of the input and output transducer element and the resonator means, are determined by the slits and their extensions. The length of each slit is determined so that the bottom portion of the slit transmits the edge-mode vibration of one of plate regions at both sides of the slit to the other one. The first and second exciting electrode means are formed in a region corresponding to the first piezoelectric plate means, and the first and second output electrode means are formed in another region corresponding to the second piezoelectric plate means.

The first and second exciting electrode means are rectangular electrodes which are formed on both surfaces of the first piezoelectric plate means to extend over its entire width.

In another arrangement, generally half-circle electrodes are formed on both surfaces of the first piezoelectric plate means to have a contour along a positive isoline of a surface strain of the first piezoelectric plate means due to its edge-mode vibration.

A "surface strain" $\Delta$ is defined by the following equation:

$$\Delta = (\partial u_1/\partial x_1) + (\partial u_2/\partial x_2)$$

where $x_1$ is the distance in a width direction of the semi-infinite strip, $x_2$ is the distance in a lengthwise direction of the strip from a free end, and $u_1$ and $u_2$ are displacements in $x_1$ and $x_2$ directions, respectively.

In a further arrangement, the first exciting electrode means is a generally half-circle electrode which is formed on one surface of the first piezoelectric plate means to have a contour along a positive isoline of a surface strain of the first piezoelectric plate means due to its edge-mode vibration. The second exciting electrode means are a pair of peripheral electrodes which are formed at both sides on the same surface as the first exciting electrode. Each of them has a contour along a negative isoline of the surface strain of the first piezoelectric plate means due to its edge-mode vibration. The pair of peripheral electrodes are connected to one another. On the other surface of the first piezoelectric plate means, stray electrodes are formed in registry with, and in symmetry with, the first and second exciting electrodes.

The first and second output electrode means are formed on the second piezoelectric plate means similar to the first and second exciting electrode means.

Further objects, features and aspects of this invention will be understood from the following detailed description of preferred embodiments of this invention referring to the drawings annexed hereto.

BRIEF DESCRIPTION OF THE DRAWINGS

FIGS. 5a, 5b and 5c show a known piezoelectric resonator using edge-mode vibration, FIG. 5a being a front view, FIG. 5b being a rear view and FIG. 5c being a sectional view taken along line C—C in FIG. 5b;

FIGS. 6a and 6b show a known piezoelectric filter using an edge-mode vibration of a semi-infinite piezoelectric plate, FIG. 6a being a front view and FIG. 6b being a rear view;

FIGS. 7a, 7b and 7c show an embodiment of a transducer used in mechanical filters according to this invention, FIG. 7a being a front view, FIG. 7b being a rear view, and FIG. 7c being sectional view taken along a line C—C in FIG. 7b;

FIG. 8 is a perspective view of one embodiment of this invention;

FIG. 9 is a perspective view of another embodiment of this invention;

FIG. 10 is a perspective view of another embodiment of this invention;

FIGS. 20a, 20b and 20c show another transducer used in this invention, FIG. 20a being a front view, FIG. 20b being a rear view, and FIG. 20c being a bottom view; and FIGS. 21a, 21b and 21c show still another transducer used in this invention, FIG. 21a being a front view, FIG. 21b being a rear view, and FIG. 21c being a bottom view.

DETAILED DESCRIPTION OF PREFERRED EMBODIMENTS

Figure 1:
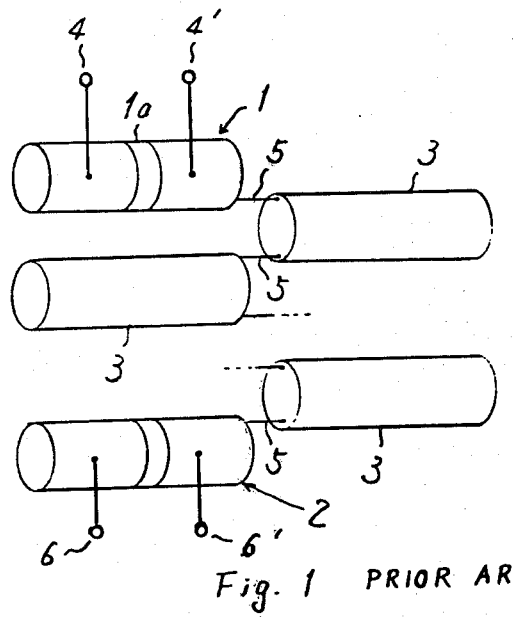
FIG. 1 is a schematic perspective view of a known piezoelectric mechanical filter.

Referring to FIG. 1, a known longitudinal-mode piezoelectric mechanical filter includes an input transducer of a longitudinal-mode Langevin type 1, an output transducer of a longitudinal-mode Langevin type 2, and a plurality of resonators 3. When a signal is applied to input terminals 4–4', a piezoelectric disk 1a is excited to vibrate at a resonant frequency of a thickness mode. The vibration is transmitted to a resonator of a rod 3 through a coupling wire 5 so that resonator 3 vibrates in a longitudinal mode. The vibration is also transmitted to the next resonator 3 through a coupling wire 5. After being transmitted to resonators 3 one after another through coupling wires 5, the vibration is transmitted to output transducer 2. The vibration transmitted to output transducer 2 is transduced into an electrical signal which is taken out from output terminals 6–6'.

Since transducers 1 and 2 and resonators 3 vibrate in longitudinal mode, it is quite difficult to reliably support them. Furthermore, the connection of the input and output lead wires to Langevin transducers 1 and 2 is difficult and is apt to be broken due to vibration.

Figure 2:
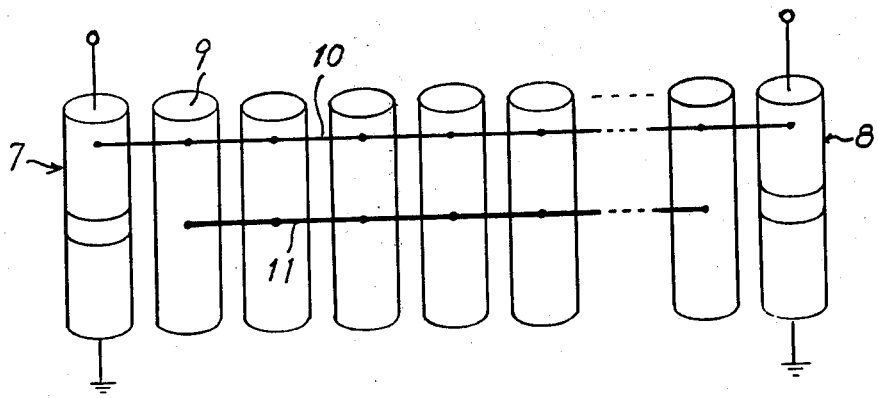
FIG. 2 is a schematic perspective view of another known piezoelectric mechanical filter.

FIG. 2 shows a known torsional-mode piezoelectric mechanical filter which includes torsional-mode Langevin transducers 7 and 8 and resonators or rods 9. Transducers 7 and 8 and resonators 9 are mechanically coupled by a common coupling wire 10 which is fixed on the outer surface of each resonator 9 near one end. All resonators 9 are supported by a common support wire 11 which is fixed on the outer surface of each resonator 9 at its half-length position. Torsional-mode vibration is transmitted to resonators 9 one after another through coupling wire 10. Since transducers 7 and 8 and resonators 9 are twisted, it is quite difficult to support transducers 7 and 8 and resonators 9 reliably. Support wire 11 is apt to fall off from resonators 9 during operation.

Therefore, this invention seeks to provide a piezoelectric mechanical filter wherein connection of lead wires and support of transducers and resonators are simple and reliable. To this end, an edge-mode vibration of a semi-infinite piezoelectric plate is used.

Figure 3:
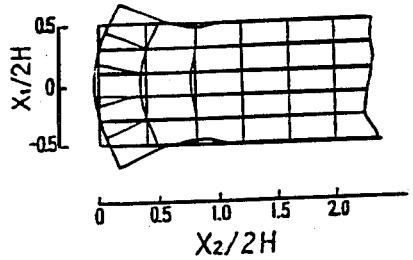
FIG. 3 schematically shows a pattern of an edge-mode vibration of a semi-infinite or long piezoelectric plate.
Figure 4:
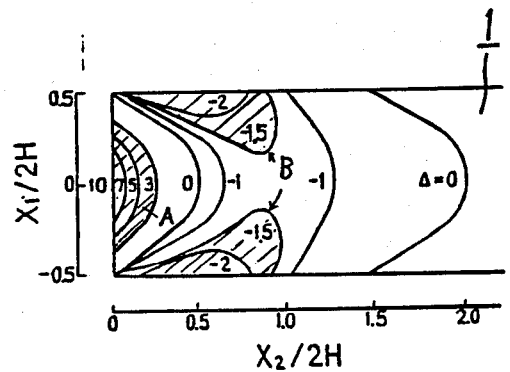
FIG. 4 schematically shows a surface strain distribution of a semi-infinite or long piezoelectric plate due to its edge-mode vibration.

As disclosed in our paper "An Analysis of Edge Modes in a Semi-Infinite Piezoelectric Strip and its Application to Resonators and Filters" by Y. Iseki, H. Watanabe and H. Shimizu, US 79-20, in Technical Journal of Electronics and Communication Engineers of Japan, July 20, 1979, pp. 23–29, an edge-mode vibration pattern of a semi-infinite or long piezoelectric plate of a width 2 H which is polarized in its thickness direction, is as shown in FIG. 3 and a distribution of a surface strain ($\Delta = (\partial u_1/\partial x_1) + (\partial u_2/\partial x_2)$ as described hereinbefore) of the semi-infinite or long piezoelectric plate is as shown in FIG. 4. Referring to FIG. 3, no displacement is observed in plate portion of $x_2/2\,H > 1.5$, where $x_2$ is the distance from a free end of the plate. FIG. 4 shows that the surface strain is zero ($\Delta = 0$) in the plate portion of $x_2/2\,H > 1.5$. Therefore, it is understood that the piezoelectric plate can be reliably supported at the portion of $x_2/2\,H > 1.5$ without affecting the edge-mode vibration.

We proposed a two-terminal piezoelectric resonator and a three-terminal single-mode piezoelectric filter using the edge-mode vibration of a semi-infinite or long piezoelectric plate, in the paper as described above.

Referring to FIGS. 5a–5c, the resonator proposed in the paper comprises a semi-infinite or long piezoelectric plate 12 which is polarized in the thickness direction. A generally half-circle electrode 13 is formed on a surface of an end portion of the plate to have a contour along a positive isoline of the surface strain $\Delta$. For example, electrode 13 is formed to cover a hatched region A in FIG. 4. A pair of peripheral electrodes 14a and 14b are formed at both sides of half-circle electrode 13 on the same surface of the plate. Each peripheral electrode has a contour along a negative isoline of the surface strain $\Delta$. For example, peripheral electrode 14 is formed to cover a hatched region B in FIG. 4. Terminals 15, 16a and 16b are formed to extend lengthwise from respective electrodes 13, 14a and 14b. Stray electrodes 13', 14'a and 14'b are formed on the other surface of the plate in symmetry with, and in registry with, half-circle electrode 13, peripheral electrodes 14a and 14b, respectively. Half-circle stray electrode 13' is connected with a pair of peripheral stray electrodes 14'a and 14'b as shown at 17a and 17b in FIG. 5b. When a signal is applied to terminal 15 and a common connection of two terminals 16a and 16b, the resonator vibrates in an edge-mode at a resonance frequency determined by the width of the plate 12.

Referring to FIGS. 6a and 6b, the single-mode piezoelectric filter proposed in the paper is arranged similar to the resonator of FIGS. 5a–5c, except that the half-circle stray electrode is separated into two quarter-circle regions 13'a and 13'b by a slit 18. Similar parts are represented by the same reference characters as in FIGS. 5a–5c. When a signal is applied to terminals 15–16a, the plate 12 vibrates in the edge mode at a resonance frequency determined by the width of the plate 12. A filter-output is taken out from terminals 15–16b. In the filter, since the half-circle electrode is separated into two quarter-circle regions 13'a and 13'b, a capacity ratio is increased at either one of input side and output side, in comparison with that of the resonator of FIGS. 5a–5c. This means that the separation of the half-circle electrode 13 is not desired to increase above a specific band width. Accordingly, it is desired to arrange a filter using the edge-mode vibration without separation of any electrode.

To this end, we attempted to make a mechanical filter using edge-mode piezoelectric resonators in FIGS. 5a–5c as piezoelectric transducers.

FIGS. 7a–7c show an embodiment of a resonator which is used as a transducer in a piezoelectric mechanical filter according to the this invention. The resonator shown is similar to resonator of FIGS. 5a–5b except for a common connection 19 between terminals 16a and 16b. Similar parts are represented by the same characters as in FIGS. 5a–5c.

As piezoelectric plate 12, a $Pb(Zr-Ti)O_3$ ceramic plate, a $BaTiO_3$ ceramic plate, a $PbTiO_3$ ceramic plate, a $LiNbO_3$ monocrystal plate, a $LiTaO_3$ monocrystal plate, or a ZnO-coated constant modulus alloy plate is used such as elinvar plate. The width of the plate is determined by the resonance frequency desired, and its length is determined to be 1.5 or more times the width.

Referring to FIG. 8, an embodiment of this invention is a dual-mode piezoelectric mechanical filter using the edge-mode vibration, which includes an input transducer IT, an output transducer OT and a coupling rod 20. Each of transducers IT and OT has the same arrangement as the resonator of FIGS. 7a–7b. Piezoelectric plates 12 of input and output transducers IT and OT are supported on a mount 21 at their ends opposite the end portions on which electrodes 13–14b are formed, and are arranged parallel to one another. The opposite ends of coupling rod 20 are connected to input and output transducers IT and OT at the end edges of respective plates 12 opposite mount 21. In the arrangement, the edge-mode vibration of either plate 12 is transmitted to the other plate 12.

The common connections 19 of input transducer IT and output transducer OT are commonly grounded, and a signal is applied to terminal 15 of input transducer IT through a lead wire 22. Then, input transducer IT vibrates in the edge mode at the predetermined resonance frequency. The edge-mode vibration is transmitted to the edge of plate 12 of output transducer OT through coupling rod 20. An output signal corresponding to the edge-mode vibration of piezoelectric plate 12 of output transducer OT is taken out from terminal 15 of output transducer OT through a lead wire 23.

In the arrangement, transducers IT and OT are supported at their portions in no relation to the edge-mode vibration, and terminal electrodes are formed on surface regions in no relation to the edge-mode vibration. Therefore, the support of the transducers and the connection of the lead wires are simplified and reliably made.

Referring to FIGS. 9 and 10, a multi-mode filter is obtained by interposing one or more resonators 24 (three shown in FIGS. 9 and 10) between input and output transducers IT and OT.

Each resonator 24 is a semi-infinite plate of a piezoelectric material such as Pb(Zr-Ti)O$_3$ ceramic, BaTiO$_3$ ceramic, PbTiO$_3$ ceramic, LiNbO$_3$ monocrystal or LiTaO$_3$ monocrystal, or a constant modulus alloy such as elinvar. One end of resonator 24 is supported together with transducers IT and OT by any support means such as mount 21 in FIG. 8, and the other end is connected to the coupling rod.

In FIG. 9, a single coupling rod 20' is used to mechanically couple all of the transducers and resonators with one another. That is, one of the end edges of the input and output transducers IT and OT are connected to opposite ends of single coupling rod 20', with the end edges of resonators 24 connected to equally-spaced positions of coupling rod 20'.

In FIG. 10, input transducer IT and adjacent resonator 24 are connected by a rod 25 at their end edges opposite the support means. Output transducer OT and adjacent resonator 24 are also connected by a rod 26 at their end edges opposite the support means. But three resonators 24 are mechanically coupled by two rods 27, 27' which are connected not to end edges of resonators 24 but to both side edges near the end edges of resonators 24.

In either arrangement of FIG. 9 and FIG. 10, the edge-mode vibration of input transducer IT is transmitted to output transducer OT through resonators 24 one after another through coupling rod 20', or coupling rods 25-27, and the filtered signal is taken out from output transducer OT. Each resonator also vibrates in the edge-mode and, therefore, support of the resonator is reliably made, similar to that of transducers.

In FIGS. 9-10, transducers IT and OT and resonators 24 are disposed in different parallel planes. But they may be disposed in a common plane as shown in FIGS. 11 and 12.

Figure 11:
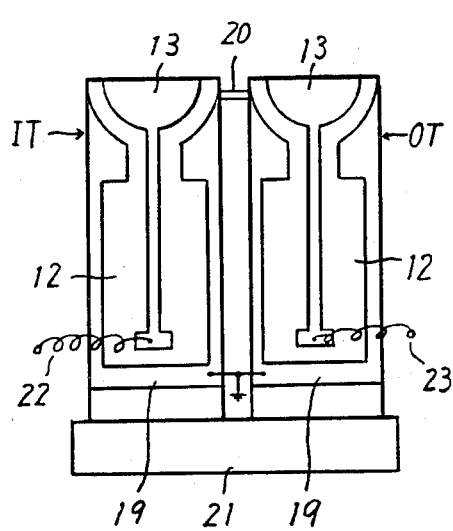
FIG. 11 is a front view of another embodiment of this invention.

FIG. 11 shows a dual-mode filter corresponding to that of FIG. 8. In the arrangement shown, coupling rod 20 is fixed not to end edges of transducers IT and OT but to confronting side edges near the end edges thereof. The edge-mode vibration is transmitted from input transducer IT to output transducer OT through coupling rod 20.

Figure 12:
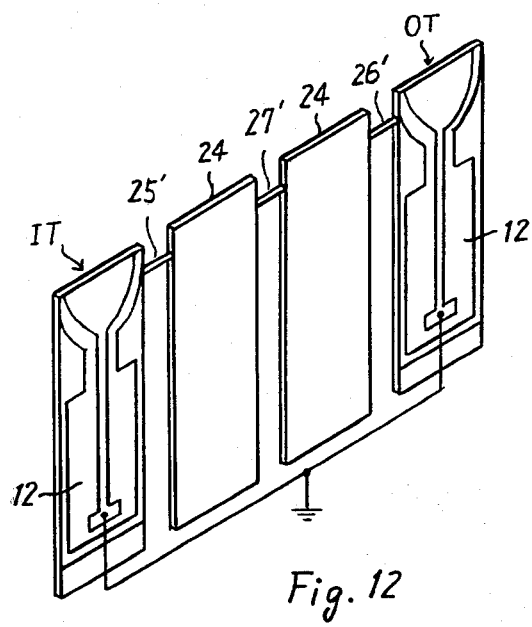
FIG. 12 is a perspective view of still another embodiment.

FIG. 12 shows a filter having two resonators corresponding to that of FIG. 9. In the arrangement, adjacent ones of transducers IT and OT and resonators 24 are mechanically coupled with one another by a coupling rod, as shown at 25', 26' and 27', opposite ends of which are connected to confronting side edges near end edges of adjacent elements. In the arrangement, the edge-mode vibration of input transducer IT is transmitted to output transducer OT through resonators 24 and coupling rods 25', 27' and 26', one after another.

The arrangement the transducers and resonators in a common plane makes it possible to realize a filter of a monolithic type.

Figure 13:
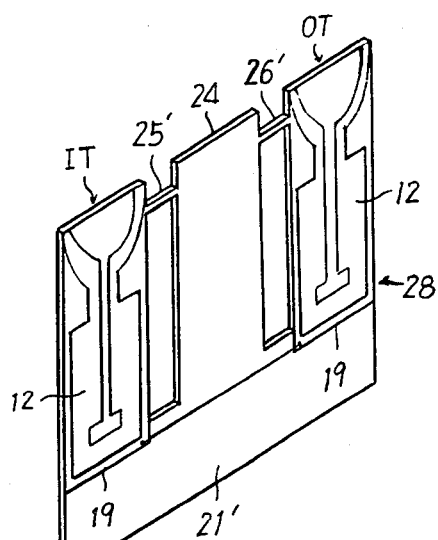
FIG. 13 is a perspective view of a mechanical filter of a monolithic type according to an embodiment of this invention.

Referring to FIG. 13, plates 12 of input and output transducers IT and OT, resonator 24, coupling rods 25' and 26' and a support plate 21' are formed integral with one another by punching a large square piezoelectric plate 28. On each plate region 12, the electrode-terminal arrangement as shown in FIGS. 7a-7b is formed by means of, for example, printing method. Thus, a simple mechanical filter of a monolithic type can be obtained.

Figure 14:
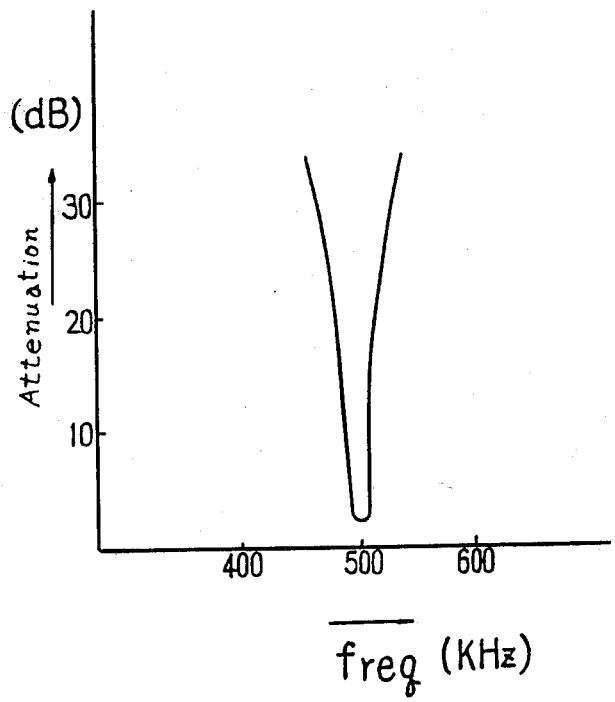
FIG. 14 is a frequency-attenuation response of the embodiment of FIG. 8.

For a demonstration of frequency responses of edge-mode mechanical filters as shown in FIGS. 8-13, an example of the response of the filter of FIG. 8 is shown in FIG. 14. A piezoelectric plate having a width of 2 H=2.7 mm and a length of L=6.8 mm is used for each plate 12 of input and output transducers IT and OT in the filter tested. A rod of a diameter 0.3 mm and a length of 2.5 mm is used for coupling rod 20.

As will be seen from FIG. 14, attenuation of about 30 dB can be obtained.

Figure 15:
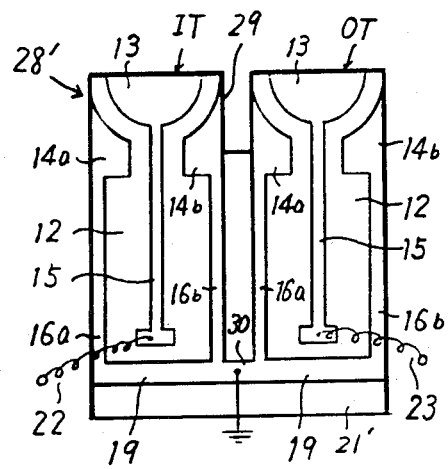
FIG. 15 is a front view of another embodiment of a monolithic type according to this invention.
Figure 16:
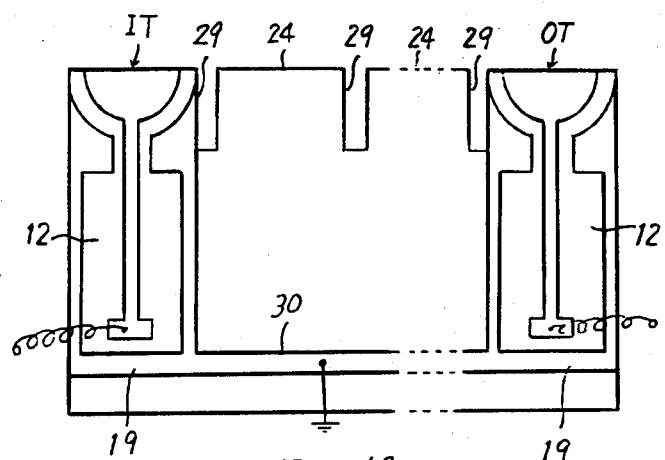
FIG. 16 is a front view of a mechanical filter of a monolithic type according to an embodiment of this invention.

In a mechanical filter of a monolithic type according to this invention, transducer regions and resonator regions are separated by a slit or slits 29 which are formed in a large square piezoelectric plate 28', as shown in FIGS. 15 and 16.

Referring to FIG. 15, therein is seen a mechanical filter corresponding to the filter of FIG. 11, and similar thereto except that two transducer regions are separated by a slit 29 extending from an end edge of a large square piezoelectric plate 28' in a direction perpendicular to the end edge. On each transducer region, the electrode-terminal arrangement of FIGS. 7a-7c is formed. An electrical strip 30 is formed on plate 28' for connecting common connection 19 of input and output transducers IT and OT.

FIG. 16 shows a mechanical filter of a monolithic type corresponding to the filter of FIG. 13 having at least one resonator 24. In this embodiment, not only are the transducers but resonators 24 are also defined by slits 29 formed to extend at equally spaced positions of an end edge of a large square piezoelectric plate 28'. The electrode-terminal arrangement as shown in FIGS. 7a-7c is also formed on each transducer regions 12. Electric conductor strip 30 is also formed on plate 28' to connect common connections 19 of input and output transducers IT and OT.

In the arrangements of FIGS. 15 and 16, mechanical coupling between adjacent transducers and resonators is effected through a bottom portion of slit 29. Accordingly, an extending length and a width of slit 29 is necessary so that the edge-mode vibration of one of adjacent transducers IT and OT and resonators 24 is transmitted to the other through the bottom portion of slit 29.

In order to realize a maximum band width of the dual-mode filter of FIG. 15, it is necessary that the electromechanical coupling strength $(f_{Aa}-f_{Ar})/f_{Aa}$ the equal to the elastic coupling strength $\alpha(=(f_{Sr}-f_{Ar})/f_{Sr})$ between adjacent plate regions in the edge-mode vibration, where $f_{Sr}$ is the resonance frequency at a time when the transducers IT and OT are driven at a common mode, that is, a drive signal is commonly applied to lead wires 22 and 23, $f_{Aa}$ is an antiresonance frequency at a time when the transducers IT and OT are driven in an opposite mode, that is, a drive signal is applied across lead wires 22 and 23 with common connections 19 not being used, and $f_{Ar}$ is the resonance frequency in at a time when the transducers IT and OT are driven at an opposite mode.

Figure 17:
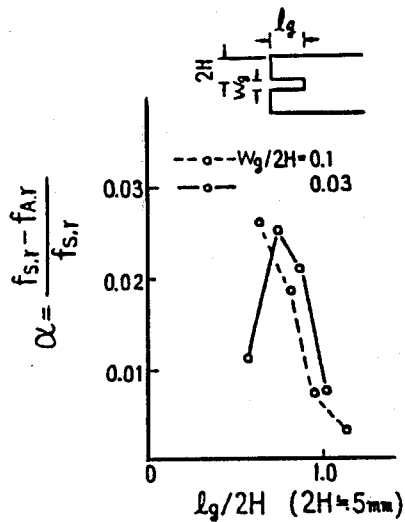
FIG. 17 shows a variation of an elastic coupling between plate regions at both sides of a slit formed on a piezoelectric plate in dependence of different sizes of the slit.

Referring to FIG. 17, variation of the strength $\alpha$ of an elastic coupling between two plate regions separated by a slit is shown as to various lengths $l_g$ and widths $W_g$ of the slit. "2 H" is the width of each separated plate region.

The piezoelectric plate has a thickness of 0.3 mm, a width of each plate region of 2 H$\approx$5 mm, and a length of each plate region of L=20 mm. Since the electromechanical coupling strength is 0.021, it is understood from FIG. 17 that the maximum band width is realized by selecting $W_g/2$ H=0.03 and $l_g/2$ H=0.87.

Figure 18:
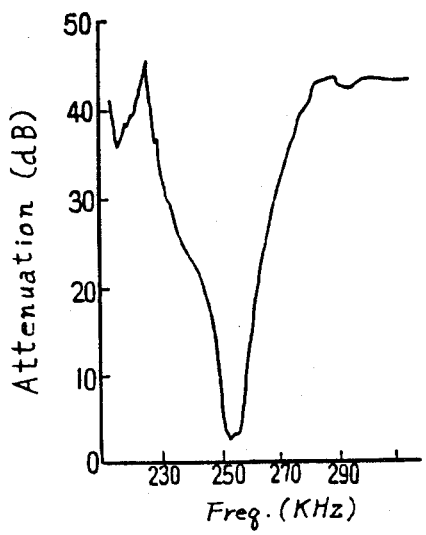
FIG. 18 shows a frequency-attenuation response of the filter of FIG. 15.
Figure 19:
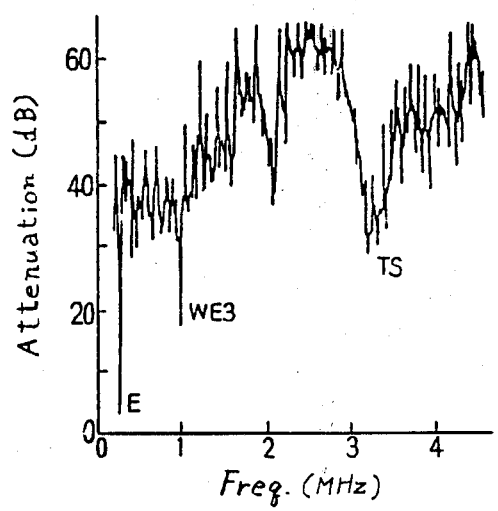
FIG. 19 shows a sprious response of the filter of FIG. 15.

According to the result, a monolithic mechanical filter of FIG. 15 was made and tested. The measured attenuation-frequency response and spurious response are shown in FIGS. 18 and 19. The 3 dB band width is about 8.0 KHz as seen in FIG. 18 and this corresponds to about twice the specific band width of the singlemode filter of FIGS. 6a and 6b. Referring to FIG. 19, spurious signals of WE3 mode are and TS mode present but these are reduced in comparison with the single mode filter of FIGS. 6a and 6b.

This invention has been described as to use of the resonator of FIGS. 7a–7c as each transducer. But it is natural to use the resonator shown in FIGS. 5a–5c. Moreover, a resonator shown in FIGS. 20a–20c may also used wherein generally half-circle electrodes 13 and 13' are formed on both sides of a piezoelectric plate 12. That, this is corresponding to the resonator of FIGS. 7a–7c but peripheral electrodes 14a–14'b of both surfaces being omitted. Therefore, the exciting electrodes are half-circle electrodes 13 and 13' of both surfaces. Accordingly, electrode terminals 15' and 16' are formed to extend along side edges of plate 12.

Furthermore, as shown in FIGS. 21a–21c, rectangular electrodes 31 and 32 may be used in place of half-circle electrodes 13 and 13+ of the resonator of FIGS. 20a–20c. Each rectangular electrode extends over the entire width of the plate.

What is claimed is:

1. A multiple resonant mechanical filter using edge-mode vibration of a long piezoelectric plate comprising:
    an input resonator/transducer element which has a first long piezoelectric plate means polarized in its thickness direction and having a width determined by a predetermined resonance frequency, first and second exciting electrode means formed on an end portion of said first long piezoelectric plate means to excite said first piezoelectric plate means to vibrate in an edge mode, and first and second input terminal means connected with said first and second exciting electrode means, respectively;
    an output resonator/transducer element which has a second long piezoelectric plate means polarized in its thickness direction and having a width determined by a predetermined resonance frequency, first and second output electrode means formed on an end portion of said second long piezoelectric plate means to take out a signal corresponding to edge-mode vibration of said second piezoelectric plate means, and first and second output terminal means connected with said first and second output electrode means, respectively;
    means for mechanically coupling said input resonator/transducer element and said output resonator/transducer element to transmit the edge-mode vibration from said input resonator/transducer element to said output resonator/transducer element;
    means for electrically connecting said second input terminal means and said second output terminal means; and
    means for supporting said first and second piezoelectric plate means at the other end portions thereof.

2. The multiple resonant mechanical filter as claimed in claim 1, which further comprises at least one further resonator means as a long vibratory plate of a predetermined width, said further resonator means being disposed between said input and output resonator/transducer elements and connected to said mechanical coupling means at one end portion thereof, and with the other end supported by said supporting means.

3. The multiple resonant mechanical filter as claimed in claim 1, wherein said input and output resonator/transducer elements are disposed parallel to one another spaced by a predetermined distance to extend in different parallel planes.

4. The multiple resonant mechanical filter as claimed in claim 2, wherein said input and output resonant/transducer elements and said resonator means are disposed one after another in parallel relation to extend in different parallel planes spaced from one another by a predetermined distance.

5. The multiple resonant mechanical filter as claimed in claim 3 or 4, wherein said mechanical coupling means is a rod which is connected to said input and output resonator/transducer elements and said resonator means at their ends opposite said supporting means.

6. The multiple resonant mechanical filter as claimed in claim 4, wherein a plurality of said further resonator means are disposed between said input and output resonator/transducer elements, said mechanical coupling means comprising a first rod connecting said input resonator/transducer element and a further resonator means adjacent thereto at their end edges opposite said supporting means, a second rod connecting said output resonator/transducer element and a further resonator means adjacent thereto at their end edges opposite said supporting means, and third and fourth rods connecting a plurality of resonator means at both side edges near their end edges opposite said supporting means.

7. The multiple resonant mechanical filter as claimed in claim 1, wherein said input and output resonator/transducer elements are disposed a common plane in parallel to one another with a predetermined spacing therebetween, said mechanical coupling means being a rod having opposite ends which are connected to confronting side edges of said input and output resonator/transducer elements near their ends opposite said supporting means.

8. The multiple resonant mechanical filter as claimed in claim 2, wherein said input and output resonator/transducer elements and said further resonator means are disposed in a common plane parallel to one another with a predetermined spacing therebetween, said mechanical coupling means being rods each of which connects adjacent ones of said input and output resonator/transducer elements and said further resonator means at their side edges near their ends opposite said supporting means.

9. The multiple resonant mechanical filter as claimed in claim 7, wherein said first and second piezoelectric plate means, said mechanical coupling rod and said supporting means are integrally formed by punching a piezoelectric plate.

10. The multiple resonant mechanical filter as claimed in claim 8, wherein said first and second piezoelectric plate means, said mechanical coupling rods and said supporting means are integrally formed by punching a piezoelectric plate.

11. The multiple resonant mechanical filter as claimed in claim 9 or 10, wherein said second input terminal means, said second output terminal means and said electrical connecting means are formed on the first piezoelectric plate means, second piezoelectric plate means and the supporting means, respectively.

12. The multiple resonant mechanical filter as claimed in claim 1, wherein said first piezoelectric plate means, said second piezoelectric means, said mechanical coupling means and said supporting means are integrally formed on a generally rectangular piezoelectric plate having a slit which extends from one end edge thereof in a direction perpendicular to said one end edge to determine two regions corresponding to said first and second piezoelectric plate means at both sides of said slit and the extension thereof, the length of said slit being such that the bottom portion of said slit transmits the edge-mode vibration of one of said two regions to the other region.

13. The multiple resonant mechanical filter as claimed in claim 2, wherein said first piezoelectric plate means, said second piezoelectric plate means, said resonator means, said mechanical coupling means and said supporting means are integrally formed on a generally rectangular piezoelectric plate having slits which extend from one end edge thereof at equally-spaced positions in a direction perpendicular to said one end edge to determine a plurality of regions corresponding to said first and second piezoelectric plate means and said further resonator means separated from said slits and their extensions, the length of each slit being such that the bottom portion of said each slit transmits the edge-mode vibration of one of said plate regions at both sides of said each slit to the other plate region.

14. The multiple resonant mechanical filter as claimed in claim 12 or 13, wherein said first and second input terminal means, said first and second output terminal means and said electric connecting means are formed on said piezoelectric plate.

15. The multiple resonant mechanical filter as claimed in claim 1, wherein each of said first and second piezoelectric plate means is composed of a material selected from the group consisting of Pb (Zr-Ti)O$_3$ ceramic plate, BaTiO$_3$ ceramic plate, PbTiO$_3$ ceramic plate, LiNbO$_3$ monocrystal plate, LiTaO$_3$ monocrystal plate, and ZnO-film coated constant modulus ally plate.

16. The multiple resonant mechanical filter as claimed in claim 2, wherein said further resonator means is composed of a material selected from the group consisting of Pb(Zr-Ti)O$_3$ ceramic plate, BaTiO$_3$ ceramic plate, PbTiO$_3$ ceramic plate, LiNbO$_3$ monocrystal plate, LiTaO$_3$ monocrystal plate, and ZnO-film coated constant modulus alloy plate.

17. The multiple resonant mechanical filter as claimed in claim 2, wherein said further resonator means is formed of constant modulus alloy plate.

18. The multiple resonant mechanical filter as claimed in claim 17, wherein said constant modulus alloy plate is elinvar plate.

19. The multiple resonant mechanical filter as claimed in claim 1, wherein said first and second exciting electrode means are rectangular electrodes which are formed on both surfaces of said first piezoelectric plate means to extend over its entire width.

20. The multiple resonant mechanical filter as claimed in claim 1, wherein said first and second exciting electrode means are generally half-circular electrodes which are formed on both surfaces of said first piezoelectric plate means to have a contour along a positive isoline of a surface strain of said first piezoelectric plate means due to its edge-mode vibration.

21. The multiple resonant mechanical filter as claimed in claim 1, wherein said first exciting electrode means comprises a generally half-circular electrode which is formed on one surface of said first piezoelectric plate means to have a contour along a positive isoline of a surface strain of said first piezoelectric plate means due to its edge-mode vibration, said second exciting electrode means comprising a pair of peripheral electrodes which are formed on said one surface of said first piezoelectric plate means adjacent to side edges thereof to have a contour along a negative isoline of the surface strain of said first piezoelectric plate means due to its edge-mode vibration, said pair of peripheral electrodes being connected with one another.

22. The multiple resonant mechanical filter as claimed in claim 21, wherein said first piezoelectric plate means comprises three stray electrodes on the other surface thereof which are in symmetry with, and in registry with, said half-circular electrode and said pair of peripheral electrodes, said three stray electrodes being connected with one another.

23. The multiple resonant mechanical filter as claimed in claim 1, wherein said first and second output electrode means comprise rectangular electrodes which are formed on both surfaces of said second piezoelectric plate means to extend over its entire width.

24. The multiple resonant mechanical filter as claimed in claim 1, wherein said first and second output electrode means are generally half-circular electrodes which are formed on both surfaces of said second piezoelectric plate means to have a contour along a positive isoline of a surface strain of said second piezoelectric plate means due to its edge-mode vibration.

25. The multiple resonant mechanical filter as claimed in claim 1, wherein said first output electrode means comprises a generally half-circular electrode which is formed on one surface of said second piezoelectric plate means to have a contour along a positive isoline of a surface strain of said second piezoelectric plate means due to its edge-mode vibration, said second output electrode means comprising a pair of peripheral electrodes which are formed on said one surface of said second piezoelectric plate means adjacent to side edges thereof to have a contour along a negative isoline of the surface strain of said second piezoelectric plate means due to its edge-mode vibration, said pair of peripheral electrodes being connected with one another.

26. The multiple resonant mechanical filter as claimed in claim 25, wherein said second piezoelectric plate means comprises three stray electrodes on the other surface thereof which are in symmetry with, and in registry with, said half-circular electrode and said pair of peripheral electrodes, said three stray electrodes being connected with one another.

27. The multiple resonant mechanical filter as claimed in claim 12, wherein said generally rectangular piezoelectric plate is composed of a material selected from the group consisting of Pb(Zr-Ti)O$_3$ ceramic plate, BaTiO$_3$ ceramic plate, PbTiO$_3$ ceramic plate, LiNbO$_3$ monocrystal plate, LiTaO$_3$ monocrystal plate, and ZnO-film coated constant modulus alloy plate.

28. The multiple resonant mechanical filter as claimed in claim 13, wherein said generally rectangular piezoelectric plate is composed of a material selected from the group consisting of Pb(Zr-Ti)O$_3$ ceramic plate, BaTiO$_3$ ceramic plate, PbTiO$_3$ ceramic plate, LiNbO$_3$ monocrystal plate, LiTaO$_3$ monocrystal plate, and ZnO-film coated constant modulus alloy plate.

29. The multiple resonant mechanical filter as claimed in claim 12 or 13, wherein said first and second exciting electrode means are rectangular electrodes which are formed on both surfaces of said first piezoelectric plate region to extend over its entire width.

30. The multiple resonant mechanical filter as claimed in claim 12 or 13, wherein said first and second exciting electrode means are generally half-circular electrodes which are formed on both surfaces of said first piezoelectric plate region to extend over its entire width.

31. The multiple resonant mechanical filter as claimed in claim 12 or 13, wherein said first exciting electrode means comprises a generally half-circular electrode which is formed on one surface of said first piezoelectric plate region to have a contour along a positive isoline of a surface strain of said first piezoelectric plate regions due to its edge-mode vibration, said second exciting electrode means comprising a pair of peripheral electrodes which are formed on said one surface of said first piezoelectric plate region adjacent to side edges thereof to have a contour along a negative isoline of the surface strain of said first piezoelectric plate region due to its edge-mode vibration, said pair of peripheral electrodes being connected with one another.

32. The multiple resonant mechanical filter as claimed in claim 31, wherein each said first piezoelectric plate region comprises three stray electrodes on the other surface thereof which are in symmetry with, and in registry with, said half-circular electrode and said a pair of peripheral electrodes, said three stray electrodes being connected with one another.

33. The multiple resonant mechanical filter as claimed in claim 12 or 13, wherein said first and second output electrode means are rectangular electrodes which are formed on both surfaces of said second piezoelectric plate region to extend over its entire width.

34. The multiple resonant mechanical filter as claimed in claim 12 or 13, wherein said first and second output electrode means are generally half-circular electrodes which are formed on both surfaces of said second piezoelectric plate region to have a contour along a positive isoline of a surface strain of said second piezoelectric plate region due to its edge-mode vibration.

35. The multiple resonant mechanical filter as claimed in claim 12 or 13, wherein said first output electrode means comprises a generally half-circular electrode which is formed on one surface of said second piezoelectric plate region to have a contour along a positive isoline of a surface strain of said second piezoelectric plate region due to its edge-mode vibration, said second output electrode means comprising a pair of peripheral electrodes which are formed on said one surface of said second piezoelectric plate region adjacent to side edges thereof to have a contour along a negative isoline of the surface strain of said second piezoelectric plate region due to its edge-mode vibration, said pair of peripheral electrodes being connected with one another.

36. The multiple resonant mechanical filter as claimed in claim 35, wherein said second piezoelectric plate region comprises three stray electrodes on the other surface thereof which are in symmetry with, and in registry with, said half-circular electrode and said pair of peripheral electrodes, said three stray electrodes being connected with one another.

37. The multiple resonant mechanical filter as claimed in claim 1, wherein the length of each of said first and second piezoelectric plate means is more than 1.5 times its width.

* * * * *

UNITED STATES PATENT AND TRADEMARK OFFICE
CERTIFICATE OF CORRECTION

PATENT NO. : 4,396,895
DATED : August 2, 1983
INVENTOR(S) : SHIMIZU et al

It is certified that error appears in the above-identified patent and that said Letters Patent are hereby corrected as shown below:

```
Column  1, line 41;   delete "the deposited"
           line 42;   after "by" add --the deposited--

Column  4, line  1;   delete "a"

Column  6, line 19;   delete "the" (first occurrence)
           line 20;   after "similar to" add --the--

Column  8, line 20;   change "connection" to --connections--
           line 42;   change "the" to --be--
           line 53;   change "at" to --in--

Column  9, line  5;   change "are and TS mode" to
                      --and TS mode are--
           line 12;   after "also" add --be--
           line 22;   change "13+" to --13'--

Column 10, line 26;   after "of" add --said further--
           line 30;   change "a common plane in" to
                      --in a common plane--

Column 11, line 34;   change "ally" to --alloy
```

Signed and Sealed this

Twenty-eighth Day of February 1984

[SEAL]

Attest:

GERALD J. MOSSINGHOFF

Attesting Officer   Commissioner of Patents and Trademarks